United States Patent
Larsen et al.

(10) Patent No.: US 9,225,102 B1
(45) Date of Patent: Dec. 29, 2015

(54) INTERCONNECTION SYSTEM FOR NETWORK MODULES

(71) Applicant: Pacific Star Communications, Inc., Portland, OR (US)

(72) Inventors: Don Larsen, Portland, OR (US); Joel Livingston, Lake Oswego, OR (US)

(73) Assignee: Pacific Star Communications, Inc., Portland, OR (US)

( * ) Notice: Subject to any disclaimer, the term of this patent is extended or adjusted under 35 U.S.C. 154(b) by 0 days.

(21) Appl. No.: 14/472,254

(22) Filed: Aug. 28, 2014

(51) Int. Cl.
*H01R 13/66* (2006.01)
*H01R 13/52* (2006.01)
*H01R 24/76* (2011.01)
*H01R 29/00* (2006.01)

(52) U.S. Cl.
CPC ............... *H01R 13/52* (2013.01); *H01R 24/76* (2013.01); *H01R 29/00* (2013.01)

(58) Field of Classification Search
CPC ......... H01R 13/52; H01R 29/00; H01R 24/76
USPC ...................... 439/540.1, 928, 717
See application file for complete search history.

(56) References Cited

U.S. PATENT DOCUMENTS

| | | | | |
|---|---|---|---|---|
| 3,915,541 A * | 10/1975 | Flegel | ...................... | H02B 1/202 439/540.1 |
| 4,177,497 A * | 12/1979 | McCook | .................... | G01R 1/04 116/300 |
| 4,227,094 A * | 10/1980 | Semur | ...................... | H04Q 3/521 307/113 |
| 4,313,149 A * | 1/1982 | Hirose | ...................... | H05K 7/02 312/198 |
| 4,729,744 A * | 3/1988 | Bet | ........................... | H02B 1/26 439/717 |
| 4,738,632 A * | 4/1988 | Schmidt | ............... | H05K 7/1441 361/729 |
| 5,288,250 A * | 2/1994 | Sumida | ................ | H01R 13/514 439/701 |
| 6,261,124 B1 * | 7/2001 | Brock | ...................... | H04Q 1/13 439/540.1 |
| 6,418,027 B1 * | 7/2002 | Suzuki | .................... | G06F 1/183 361/679.02 |
| 6,881,101 B2 * | 4/2005 | Sichner | ............... | H01R 13/514 439/278 |
| 7,021,974 B2 * | 4/2006 | Sichner | ............... | H01R 13/514 439/278 |
| 7,397,668 B2 * | 7/2008 | Sekine | ................ | H01R 9/2608 361/728 |
| 7,753,740 B2 * | 7/2010 | Carolis | ............... | H01R 9/2408 439/717 |
| 7,969,729 B2 * | 6/2011 | Yang | ..................... | H05K 7/1489 165/104.25 |
| 8,074,680 B2 * | 12/2011 | De Carolis | .......... | F15B 13/0857 137/560 |
| 8,187,006 B2 * | 5/2012 | Rudisill | ................. | H01R 11/30 362/249.06 |
| 8,608,513 B2 * | 12/2013 | Lee | ......................... | F21V 15/01 439/668 |
| 2002/0058445 A1 * | 5/2002 | Tamura | ................... | G06F 1/181 439/717 |
| 2011/0086542 A1 * | 4/2011 | Chow | .................... | H01R 25/003 439/540.1 |
| 2011/0159726 A1 * | 6/2011 | Wang | .................... | H01R 13/518 439/540.1 |
| 2011/0195600 A1 * | 8/2011 | Feigl | ..................... | H05K 7/1457 439/540.1 |
| 2013/0344733 A1 * | 12/2013 | Mateo Ferr S | ........... | H04Q 1/13 439/540.1 |
| 2015/0024625 A1 * | 1/2015 | Hsieh | .................... | H01R 35/04 439/540.1 |

* cited by examiner

*Primary Examiner* — Abdullah Riyami
*Assistant Examiner* — Nelson R Burgos-Guntin
(74) *Attorney, Agent, or Firm* — Perkins Coie LLP

(57) ABSTRACT

An interconnection system for portable networking modules including a pair of male connectors on one side and a female connector and an alignment slot on an opposing side. Two or more modules can be connected in a daisy chain series by aligning a male and female connector, rotating the modules around the connectors' central axis, mating the opposing connectors, and twisting the modules into alignment. When connected, one male connector is engaged with the female connector, and the other male connector fits into the alignment slot. Twisting in the opposite direction disconnects the modules. The connectors transmit data and power between connected modules. The male connectors also receive power modules such as military radio battery packs.

22 Claims, 8 Drawing Sheets

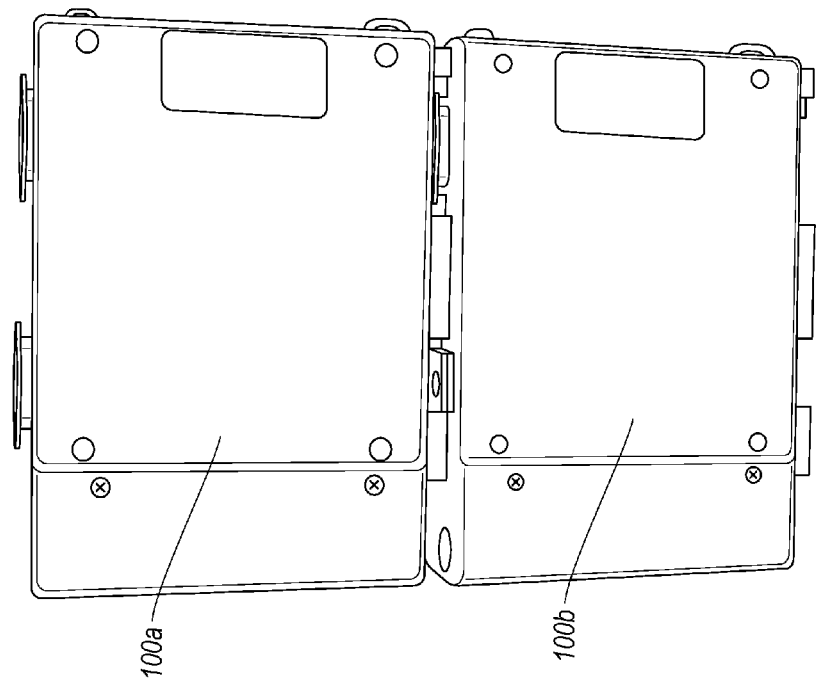
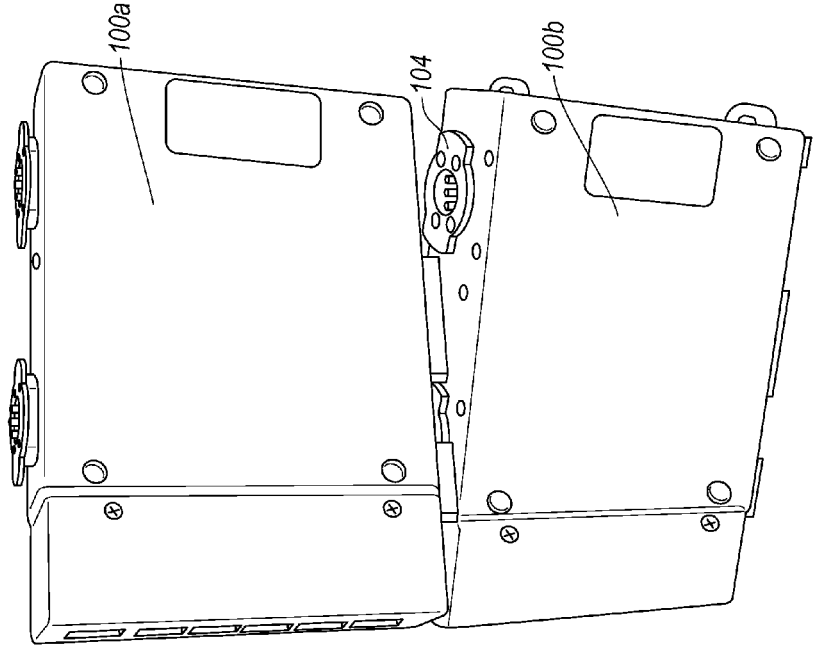
Fig. 6A
Fig. 6B

INTERCONNECTION SYSTEM FOR NETWORK MODULES

TECHNICAL FIELD

The present disclosure is directed generally to communication network modules and, more particularly, to network modules with interconnection systems, and methods and systems for connecting a series of network modules.

BACKGROUND

Various methods and systems have been developed for coupling electronic devices. Electrical connectors, for example, include a wide variety of wires, plugs, and sockets in assorted applications. Some connection technologies support connecting multiple devices in a linear sequence or "daisy chain." For instance, using FireWire or Thunderbolt ports and cables, a series of computer peripherals can be connected to one another in a daisy chain configuration. Flexible cables are typically used to connect daisy-chained devices. Such cables may transmit data and/or provide power to connected devices.

Many "edge" environments pose a challenge to connect communication and information services equipment such as computing devices, networking equipment, and other communications gear. Edge environments include battlefields, harsh environments, disaster areas, construction areas, and so on. Such edge environments are often lacking in infrastructure and relatively inaccessible, so transporting large equipment to the environment and setting up and operating equipment in the environment may be problematic or not feasible. For example, power may not be available and, when it is available, may not be reliable. Environmental factors (which may include heat, rain, wind, dust, vibrations, and/or rough handling) may also damage equipment. These conditions make traditional methods of coupling electronic devices unsuitable for edge environments.

Accordingly, there is a need for portable communication systems that can be interconnected quickly and simply, such as for use in edge environments or other remote areas.

BRIEF DESCRIPTION OF THE DRAWINGS

FIGS. 6A and 6B illustrate connection of two communication network modules having the interconnection system of FIGS. 1A and 1B.

DETAILED DESCRIPTION

Figure 1:
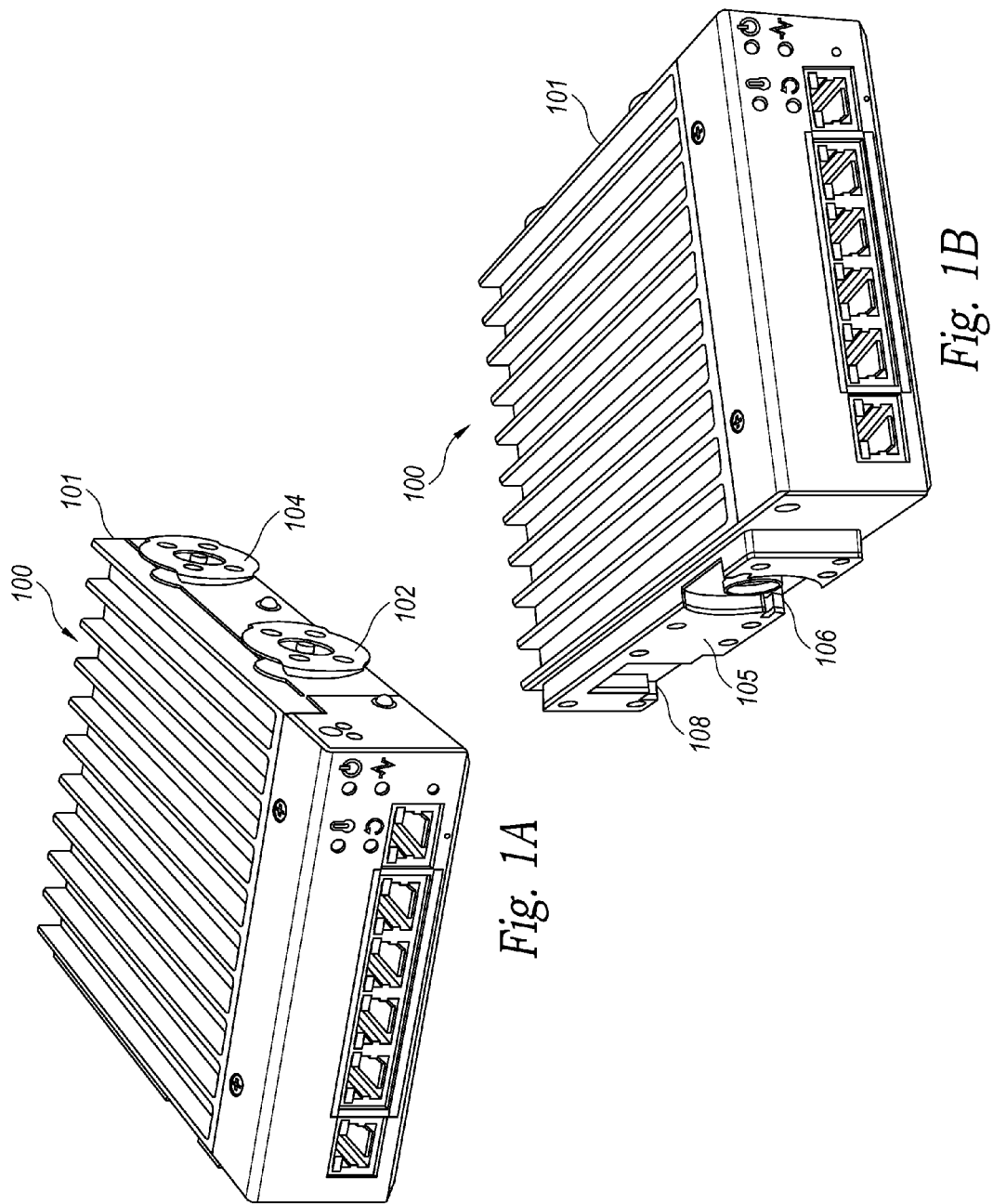
FIGS. 1A and 1B are exterior views of a communication network module having an interconnection system configured in accordance with an embodiment of the present technology.

The following disclosure describes various embodiments of systems and methods for connecting electronic modules via a mechanical and electrical interface. In various embodiments, the interconnection system provides a physical connection, power transmission, and/or a serial data link between network modules. A series of modules utilizing such an interconnection system can be coupled to expand their capability, making the system easily expandable, interchangeable, and highly transportable. Moreover, multiple connected modules can receive power via compatible battery packs, ensuring reliability and making the modules appropriate for use in edge environments, for example. The inventors have recognized that as more facilities, companies, and organizations rely on IT and communications equipment to conduct operations in edge environments, there is a need to provide equipment with features that are suitable for those environments.

In some embodiments, the technology provides interconnectable portable communication modules having a pair of male connectors on one side and a coupler including a female connector and an alignment slot on an opposing side. Two or more modules are connectable in a daisy chain series by angularly offsetting adjacent modules to generally position the respective male and female connectors of the two adjacent modules in planar alignment, bringing the male and female connectors together, and twisting the modules relative to each other to releasably interconnect the mating pairs of male and female connectors in axial alignment. When connected, one male connector is engaged with the female connector, and the other male connector fits into the alignment slot. Twisting in the opposite direction disconnects the modules.

The interconnected male and female connectors are configured to transmit data and/or power between physically connected modules. In some embodiments, the alignment slot includes electrical connections that transmit data and power between connected modules. The male connectors can also releasably interconnect with connectors of power modules, such as radio battery packs. Therefore, through the implementation of a twist-release connector and one or more paired slide-release connectors in accordance with the present disclosure, the technology enables a plurality of interconnected modules to use the same connectors to mechanically and electrically interconnect multiple modules in an interchangeable manner so as to share power, and in some embodiments, data the via the connectors without requiring wires between components.

The technology enables modules to share a physically secure connection as well. In various embodiments, the technology utilizes a twist motion of adjacent modules to engage the connectors. The male connector includes at least one engagement flange having an angled or ramped surface for connection with a surface of the female connector or alignment slot, creating an engagement for mechanical retention by friction. The female connector is configured to receive the male connector. In various embodiments, as the modules are rotated after the female connector receives the male connector, a ramped engagement flange engages a portion of the female connector, such as a tab extending behind the flange to provide a camming action resulting in lateral motion of the modules as they move to the fully engaged position. The connectors thus bring the rotated modules into secure engagement. In various embodiments, flanges on the male connectors engage both the female connector and the alignment slot or slots.

In some embodiments, the technology includes one or more mechanisms to releasably lock or otherwise secure the adjacent modules or the mating male and female connectors of the adjacent modules when the mating connectors are in a fully engaged position, maintaining the alignment of the modules and/or the connectors. For example, engaged modules can be secured using one or more of friction, a spring-loaded retaining pin and detent, a latch, an indentation on one connector and a protrusion on the opposite connector that fit together when modules are aligned, etc. A locking mechanism can be separate from the connectors (e.g., a spring-loaded retaining pin and detent that come into alignment when modules having the interconnection system are aligned, or a magnet on one module and a connecting metal surface or magnet on the adjacent module). The locking mechanism may be integrated with the connectors (e.g., a friction lock between the male connectors and the coupler that receives them). In some embodiments, the connectors include a seal feature such that the action of engaging the connectors seals them against the environment. For example, pressing or twisting connectors together causes a flexible gasket or O-ring to form a waterproof and/or dustproof seal between the modules.

Each module is connectable to a power pack, such that power is received by the module through one or more of the connectors on one side of the module. The connector on the other side of the module can releasably connect to another module so as to provide power from the power pack to the second connected module. In some embodiments, a power module configured in accordance with this disclosure includes a DC or AC electrical power connection and/or a self-contained DC power source such as batteries, a fuel cell, a solar cell, etc. Such a power module may include, e.g., power conditioning components and/or an uninterruptable power supply (UPS). Multiple power modules may be daisy-chained together according to the present disclosure to provide additional power or additional redundancy.

In some embodiments, each male connector is compatible with a portable battery pack such as a military radio battery. In the illustrated embodiments, for example, male connectors can mate with a Harris AN/PRC-152 handheld radio's rechargeable lithium-ion battery pack. Providing two or more connectors enables hot-swapping batteries as long as power is applied by at least one battery (or, e.g., standard AC electrical power) at any given time. In some embodiments, when another power source is present, connected rechargeable batteries are recharged through the connectors. By enabling computing resources to be powered by such battery packs, the disclosed technology facilitates easy and quick deployment of those resources in edge environments.

In various embodiments, the male and female connectors include data transmission features, e.g., via a serial bus that provides intercommunication between connected modules. The central portion of a connector may include a number of contact members, such as spring-loaded contact pins for power, ground, and serial data. In some embodiments, the contact pins line up with conductive contacts in an opposite connector (including, e.g., electrical connections in an alignment slot) so as to allow transmission of power and data between the modules through the engaged connectors. In some embodiments, the contact pins line up with concentric conductive rings, enabling electrical connection while modules are adjacent and in an intermediate position (e.g., while they are partly twisted), and before reaching the fully engaged position.

In some embodiments, the number of pins is larger or smaller, and/or the arrangement of contact members is different (e.g., a horizontal line instead of a vertical line; a circle or other nonlinear arrangement; or other geometric or radial arrangements). The number of contact members can be chosen to implement a known data transmission protocol or standard (e.g., USB). The connectors can include non-pin electrical contacts. For example, the disc and/or flange of a male connector is formed of conductive metal and is used for transmitting power (e.g., as a ground connection) or data. The technology may also include a conductive surface on a connector (e.g., a metal trace on a non-metallic connector surface).

The disclosed technology enables interconnected modules to be operatively as well as physically coupled. For example, a module may include Ethernet switching or routing hardware, providing local network capabilities to coupled devices and/or modules. The technology enables additional modules to be easily connected so that their function is seamlessly added to one or more existing modules. Connecting a new network switch module to an operating switch module may enable the combined modules to continue switching network traffic without interruption while expanding the switch to have a larger number of network ports. The disclosed technology thus makes it easier to deploy networking or other computing resources as required, on a modular basis. In some embodiments, the technology includes logic to detect and/or manage connected modules and/or data flows among connected modules, e.g., so that modules are hot-swappable and the connected modules automatically adjust to the addition or removal of a module. The technology thus provides for highly flexible deployments of devices.

The technology embodied in the disclosed modules enables organizations, groups, individuals, and other entities to work, provide services, or collaborate in remote locations, in locations on a temporary or transitory basis, or in other locations where a networking or computing infrastructure is damaged, unprotected, inadequate, nonexistent, or otherwise incapable of meeting particular needs. Examples of such organizations include military groups, emergency relief and disaster response and management agencies, medical teams, diplomatic and aid organizations, news organizations, first responder teams, dignitaries and delegations of traveling officials, and law enforcement agencies. Other entities that may employ the technology include, for example, organizations involved in ensuring reliable operations of infrastructure, such as health care organizations, organizations involved in energy production and transmission infrastructure, agriculture, banking, and transportation. Further, organizations involved in remote work projects such as oil exploration and extraction, mining, overseas construction, timber harvesting, or scientific exploration may employ aspects of the disclosed technology.

Example embodiments of the technology will now be described for purposes of illustration. Certain details are set forth in the following description and in FIGS. 1A-7B to provide a thorough understanding of various embodiments of the present technology. In other instances, well-known structures, materials, operations, and/or systems often associated with mechanical connectors and electrical contacts are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods, components, and so forth.

The terminology used below is to be interpreted in its broadest reasonable manner, even though it is being used in conjunction with a detailed description of certain examples of embodiments of the technology. Certain terms may even be emphasized below; however, any terminology intended to be interpreted in any restricted manner will be overtly and specifically defined as such in this Detailed Description section.

The accompanying Figures depict embodiments of the present technology and are not intended to be limiting of its scope. The sizes of various depicted elements are not necessarily drawn to scale, and these various elements may be arbitrarily enlarged to improve legibility. Component details may be abstracted in the Figures to exclude details such as position of components and certain precise connections between such components when such details are unnecessary for a complete understanding of how to make and use the technology.

In the Figures, identical reference numbers identify elements or acts with identical or similar functionality for ease of understanding and convenience. To facilitate the discussion of any particular element, the most significant digit or digits of any reference number refers to the Figure in which that element is first introduced. For example, element 104 is first introduced and discussed with reference to FIG. 1A.

FIGS. 1A and 1B are exterior views of a communication network module 100 having an interconnection system configured in accordance with an embodiment of the present technology. Although many embodiments of the present technology are described herein in the context of communication network modules, aspects of the present technology are not limited to communication network modules and generally apply to other modular devices configured to receive power and data.

In the illustrated embodiment, the module 100 is a communication network module, such as a networking switch device or other modular component. In other embodiments, the module 100 may include various other computing or networking facilities or components, e.g., non-volatile storage, data processing equipment, a communication interface (satellite, optical, cable modem, telephone modem, etc.), a server (web, application, file, database, authentication, DNS, etc.), a firewall, a router, a wireless access point, etc. The module 100 may be of larger or smaller size in various embodiments. In some embodiments, the connectors disclosed herein and the distance between them may be scaled up or down in proportion with the application. In some embodiments, modules 100 may employ an interconnection system having a larger number of connectors.

The module 100 in the orientation shown in FIG. 1A has a housing 101 and male connectors 102 and 104 mounted on one side of the module's housing 101. In the illustrated embodiment, the male connectors 102 and 104 are mounted on the housing's right side. The opposite side of the module 100, illustrated in FIG. 1B, includes a coupler assembly 105 having a corresponding female connector 106 and an alignment slot 108. The module 100 is configured to operatively interconnect with other similarly configured modules, wherein the male connectors 102 and 104 on the right side of one module releasably mate with the alignment slot 108 and the female connector 106 on the left side of an adjacent module. Similarly, the alignment slot 108 and the female connector 106 on the left side of the first module are configured to receive and releasably mate with the male connectors on the right side of another module. Accordingly, multiple modules 100 can be operatively and releasably interconnected together in a daisy chain configuration. Similarly, one module 100 in a chain of modules may be interchangeably replaced by a similarly configured module quickly and easily. To connect two modules, the male connector 102 of a left module is rotated into engagement with the female connector 106 of a right module, and the male connector 104 of the left module is rotated upward and into the alignment slot 108 of the right module, as further described herein. The illustrated left and right (and front and rear) positioning of the module connectors is for example only; the technology can include connectors placed in various relationships relative to the housing orientations including, e.g., right-and-left positioning (opposite of the illustrated positioning), top-and-bottom positioning, etc.

Figure 2:
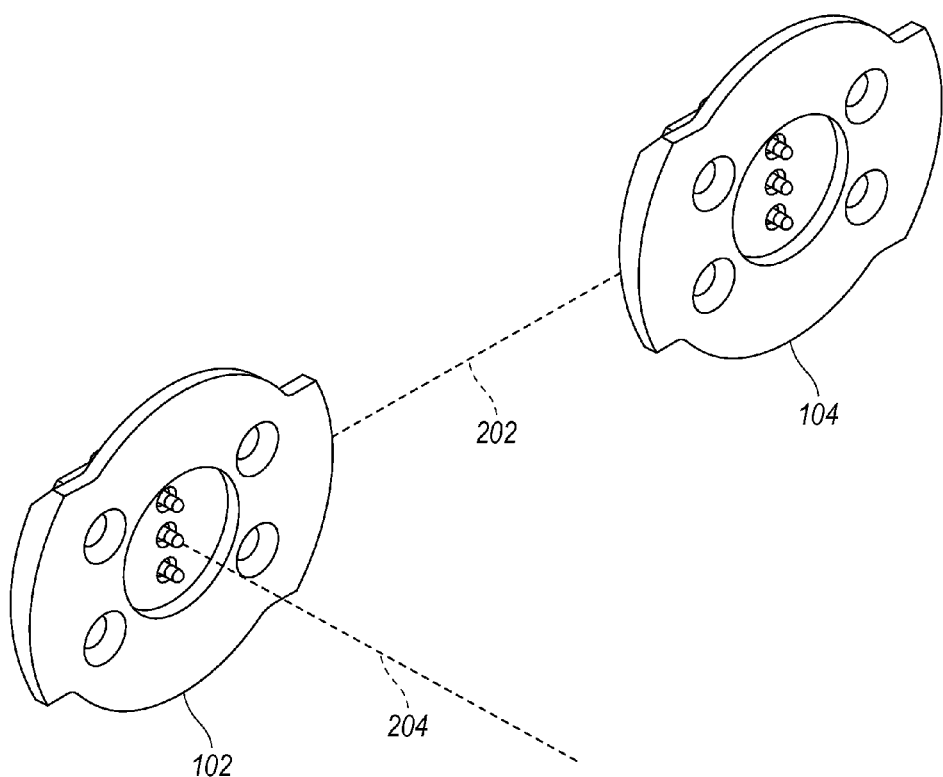
FIG. 2 is an isometric view of a pair of connectors shown removed from the module and configured in accordance with an embodiment of the present technology.

FIG. 2 is an isometric view of a pair of male connectors 102 and 104 configured in accordance with an embodiment of the present technology; the male connectors are shown removed from the module's housing 101 for purposes of illustration. The male connectors 102 and 104 have the same configuration and are coplanar with each other. The male connectors are spaced apart from each other along a mounting axis 202. A rotation axis 204 extends through the center of the male connector 102; in the illustrated embodiment of the technology, modules can be connected and disconnected by axially aligning male and female connectors substantially at the mounting axis 202 and rotating modules about the rotation axis 204.

Figure 3A:
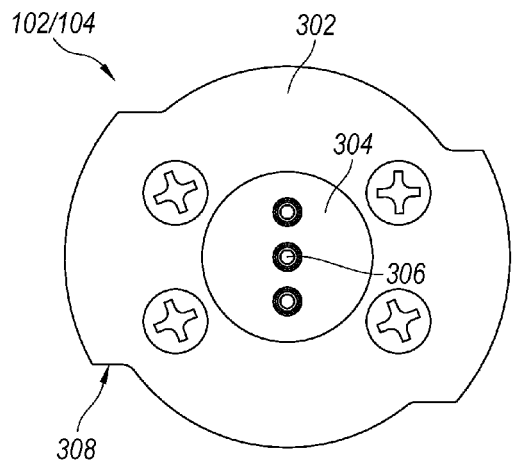
FIGS. 3A-3E are schematic diagrams illustrating one of the male connectors of FIG. 2.

FIGS. 3A-3E are schematic diagrams illustrating one of the male connectors 102/104 of FIG. 2. Turning to FIG. 3A, the male connector 102/104 has a generally planar, annular connector face 302 that defines a recessed central portion 304 with a plurality of biased, conductive contact pins 306 disposed in the recessed central portion. The contact pins 306 are operatively connected to the internal electronics of the module and configured to transmit power between interconnected modules 100 (FIG. 1A). The same contact pins 306 can also be operatively coupled to the control electronics or communication components of the module, so as to provide data to and/or from the internal components As described above, the form, number, and arrangement of contact pins 306 may vary.

Figure 3C:
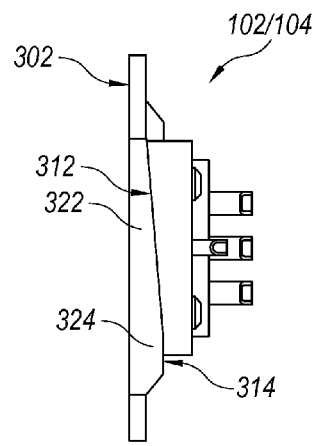
Figure 3B:
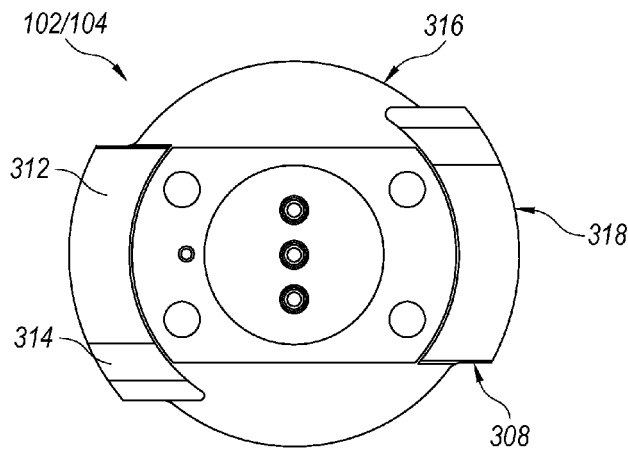
Figure 3D:
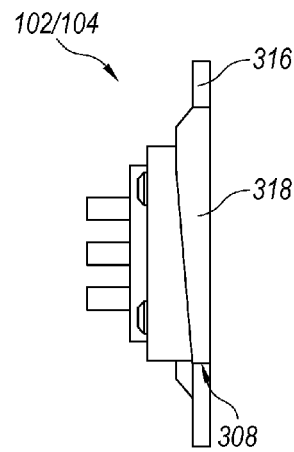

The front view of the male connector 102/104 illustrated in FIG. 3A and the rear view illustrated in FIG. 3B show that the shape of the connector face 302 has a generally circular body portion 316 with a pair of integral engagement flanges 318 projecting radially from the body portion in opposite directions. The flanges 318 on each side of the body portion 316 have the same shape but are in an inverted orientation relative to each other. FIG. 3B shows the structure of the flanges 318, which are vertically offset to either side of the connector. Looking at the flange 318 on the left side of FIG. 3B (on the right of FIG. 3A), the flange 318 has an increasing thickness 322 as the flange 318 extends away from the narrowest end to define an angled ramp surface 312 that leads to a friction pad 314 at the thick end of the flange. FIGS. 3C and 3D illustrate side views of the male connector 102/104 showing the ramp surface 312 supported by the increasing thickness 322, and the friction pad 314 adjacent to the thickest portion 324 of the flange 318. In some embodiments, the ramp surface 312 continues to an edge or rolls into a curved top surface without flattening into a friction pad 314. In the illustrated embodiment, the connector face 302 on one side, and the ramp surface 312 and the friction pad 314 on the other side, engage with an opposing female connector 106 or alignment slot 108 to form a friction-based mechanical connection between adjacent interconnected modules, as described below in further detail.

Figure 3E:
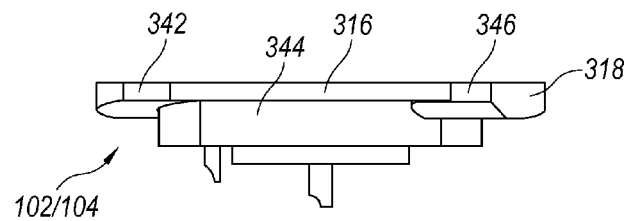

Turning to FIG. 3E, a top view of the male connector 102/104 illustrates portions of the male connector 102/104 that come into contact with parts of the coupler assembly 105 (FIG. 1B) to limit the relative rotation of interconnected modules. The stopping surfaces include an edge surface 342 at the narrow end of a flange 318 on the top of the flange 318 (which corresponds to an edge surface 308 at the narrow end of the opposite flange 318 on the bottom of the opposite flange 318); a spacer top surface 344 located behind the back face of the male connector 102/104 disk at the same vertical level of the edge surface 342; and a top edge 346 of the opposite flange 318 (near its thick end) that is vertically offset from the edge surface 342 and the spacer top surface 344.

Figure 4A:
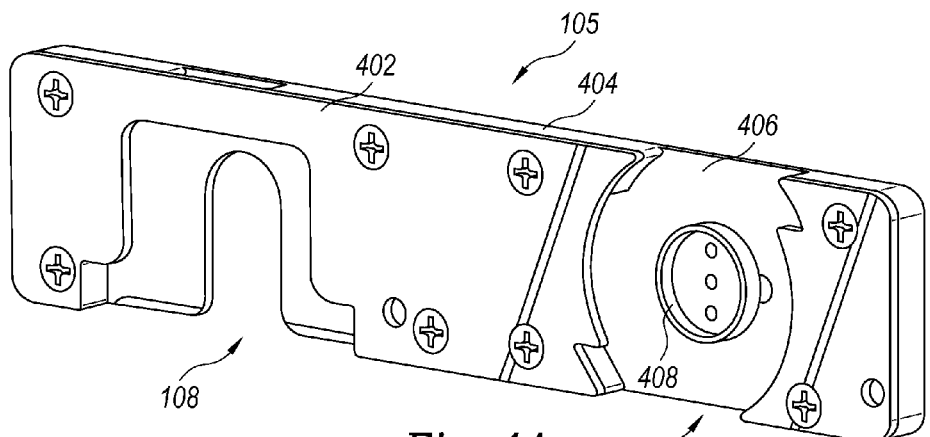
FIGS. 4A-4C are schematic diagrams illustrating a communication network module coupler configured to receive the connectors of FIG. 2.
Figure 4B:
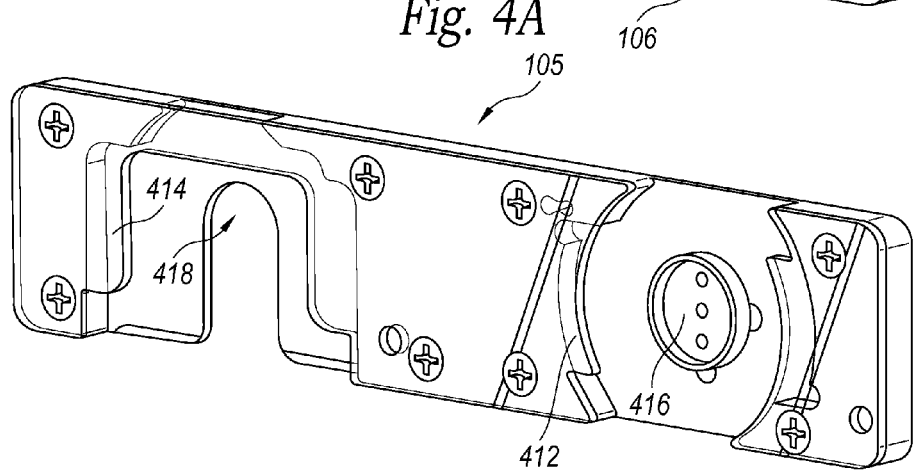
Figure 4C:
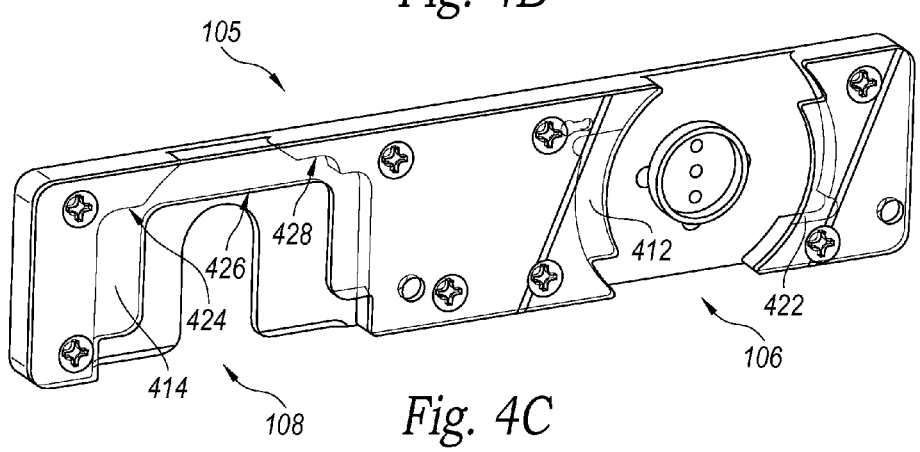

FIGS. 4A-4C are schematic diagrams illustrating the alignment slot 108 and the female connector 106 formed in the coupler assembly 105 configured to receive the connectors of FIG. 2. In the illustrated embodiment, a single coupler assembly 105 includes both the female connector 106 and the alignment slot 108, and the coupler assembly 105 is configured to attach to the housing 101 of the communication network module 100 (FIG. 1B). In other embodiments, the female connector 106 and alignment slot 108 can be separate pieces mounted to the module's housing 101, or can form a portion of the housing 101. As shown in FIG. 4A, the illustrated coupler assembly 105 is formed of an outer plate 402, a middle spacer 404, and a back surface 406. In some embodiments, the coupler assembly 105 is of differing construction but has corresponding function to operably mate with connectors, such as male connectors 102 and 104. For example, in the illustrated embodiment, the back surface 406 of the coupler assembly 105 engages or is immediately adjacent to the connector face 302 of the male connector 102/104 when the male connector is in the fully engaged position. The illustrated female connector 106 includes a centering mechanism 408 (e.g., a ring that fits into the recessed central portion 304 of a male connector 102/104) for keeping a male connector 102 centered on the rotation axis 204. The centering mechanism can also seal the mated connectors from the outside environment (e.g., water and/or dirt).

Turning to FIGS. 4B and 4C, the outer plate 402 is shown substantially transparent for purposes of illustration, to better illustrate features of the coupler assembly 105. The outer plate 402 has capture flanges 412 and 414 spaced apart from the back surface 406 by the middle spacer 404. A space in the outer plate 402 through which the back surface 406 is visible forms a receiving area for the male connectors 102/104. The capture flanges 412 and 414 form a receiving surface for the male connector flanges 318, positioned to engage and ride along the ramp surface 312 and friction pad 314 to ensure engagement of the male connectors 102/104 when rotated with respect to the alignment slot 108 and the female connector 106 to the fully engaged position. In the illustrated embodiment, the thickness of the middle spacer 404 may be slightly less than the thickest portion 324 of the flanges 318 at the friction pad 314, such that when the male connectors 102/104 are fully engaged with the coupler assembly 105, the capture flanges 412 and 414 and the back surface 406 squeeze the flanges 318 of the male connectors 102/104, creating friction for a secure engagement. The alignment slot 108 and the female connector 106 also include stopping surfaces to limit the rotation of interconnected modules once the connectors are fully engaged. The stopping surfaces include, in the middle spacer 404, stopping surfaces 422 of the female connector 106 and stopping surfaces 424 and 428 of the alignment slot 108, and in the outer plate 402, stopping edge 426 of the alignment slot 108.

To connect modules using the illustrated interconnection system, the modules 100 are moved from a disengaged or released position, wherein the connectors of the adjacent modules are spaced apart from each other, to an intermediate position, wherein the front male connector 102 is brought into planar alignment substantially at the mounting axis 202 and axially aligned on the connectors' central rotation axis 204. The male connector 102 extends through the space in the outer plate 402 with the connector face 302 of the connector 102 in close proximity to or in contact with the back surface 406 of the female connector 106. Next, the connectors (and the modules to which they are attached) are rotated with respect to one another around the rotation axis 204 of the mated connectors 102 and 106, and the male connector's ramp surface 312 and/or friction pad 314 slide against friction tabs 412 of the outer plate 402. The camming action of the ramp surface 312 moves the male connector 102 axially along the rotation axis 204 until the male connector's face 302 moves into contact with the female connector's back surface 406.

During the rotational and lateral motion, the back male connector 104 moves through an arcuate path relative to the other module and slides into the alignment slot 108 of the coupler assembly 105 of the other module. Accordingly, the ramp surface 312 and the friction pad 314 of the back male connector 104 come into contact with a friction tab 414 of the alignment slot 108 while the male connector's face 302 comes into contact with the alignment slot's back surface 406. The mating connectors are in the full engaged position when the modules are in alignment, parallel to one another, thereby providing a quick release mechanical and electrical interconnection between the modules. At the same time, the central portion 304 and contact pins 306 of the front male connector 102 align with contacts 416 in the female connector 106, and the central portion 304 and contact pins 306 of the back male connector 104 align with a center guide 418 in the alignment slot 108. The context 416 in the female connector, are operatively coupled to the internal electronics of the module and/or to the contact pins 306 in the male connectors on the other side of the module. The contacts 416 can also be connected to the internal components in the module so as to provide data to and from the internal components.

The illustrated male connectors 102 and 104 and coupler assembly 105 reach a limit of rotation around the rotation axis 204 when full engagement is reached. Turning to FIG. 4C, looking first at the alignment slot 108, when the back male connector 104 is slid into full engagement with the alignment slot 108, the male connector's edge surface 342 contacts the stopping surface 424 of the middle spacer 404; the spacer top surface 344 contacts the stopping edge 426 of the outer plate 402; and the male connector's top edge 346 contacts the stopping surface 428 of the middle spacer 404. Rotation of the front male connector 102 with respect to the female connector 106 is also restricted. When the front male connector 102 is rotated into full engagement with the female connector 106, the male connector's edge surface 308 on one flange 318 contacts the middle spacer 404 stopping surface 422, and the corresponding edge surface 342 of the male connector 102 on the opposite flange 318 contacts the corresponding feature on the opposite side of the female connector 106. Depending on the particular implementation, full engagement may be achieved without actually making contact with the described limiting surfaces; for example, a pin and detent may securely align the modules without having to hit the rotational limit. In various implementations, limits may be implemented differently or not at all. For example, in some implementations, modules connected using a combined mechanical and electrical interconnection system in accordance with the present disclosure may be fully rotatable about a connector's rotation axis 204 so that modules can be connected or disconnected by twisting in either direction.

Figure 5A:
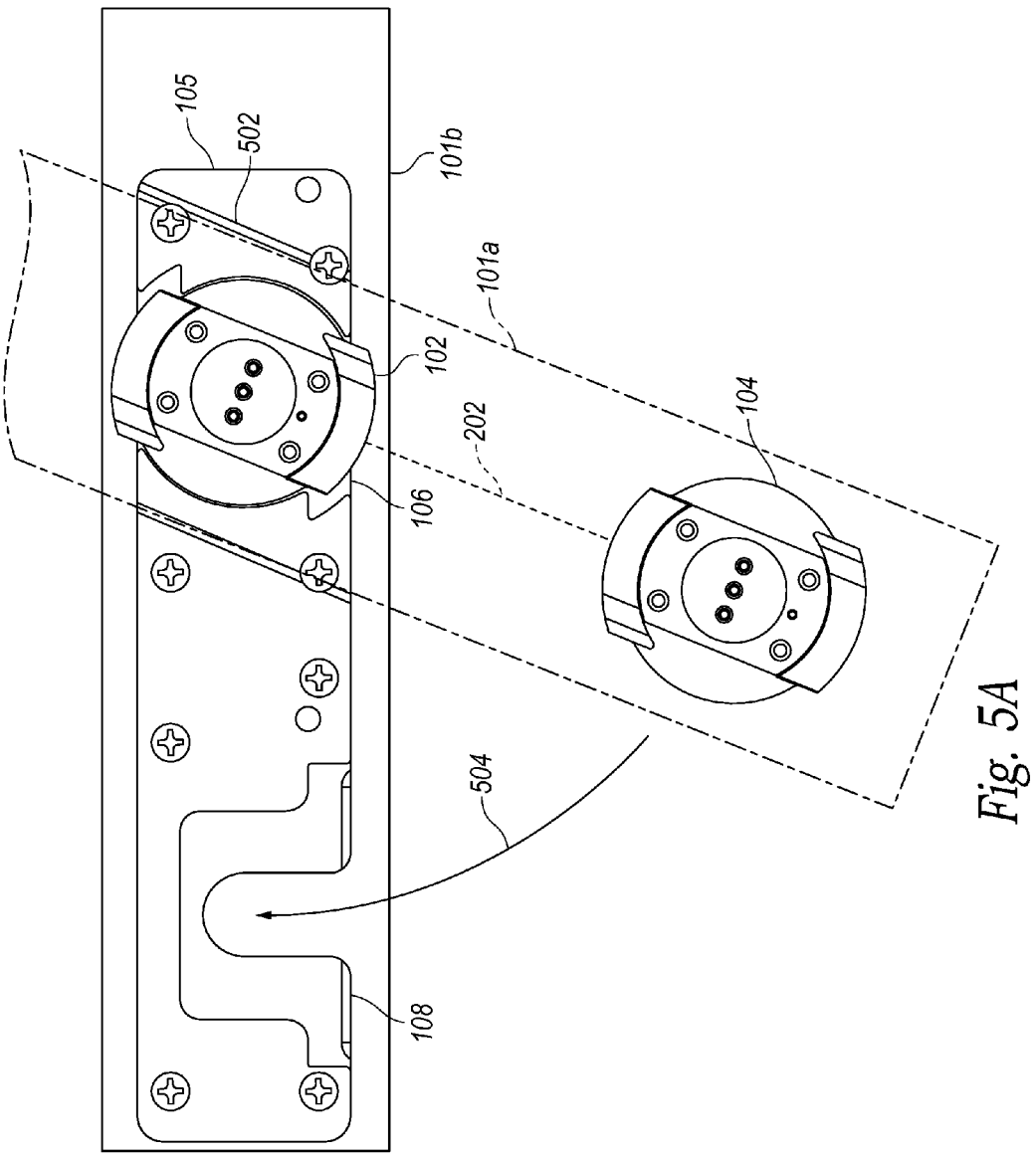
FIGS. 5A and 5B are schematic diagrams illustrating engagement of the connectors of FIG. 2 and the coupler of FIGS. 4A-4C.
Figure 5B:
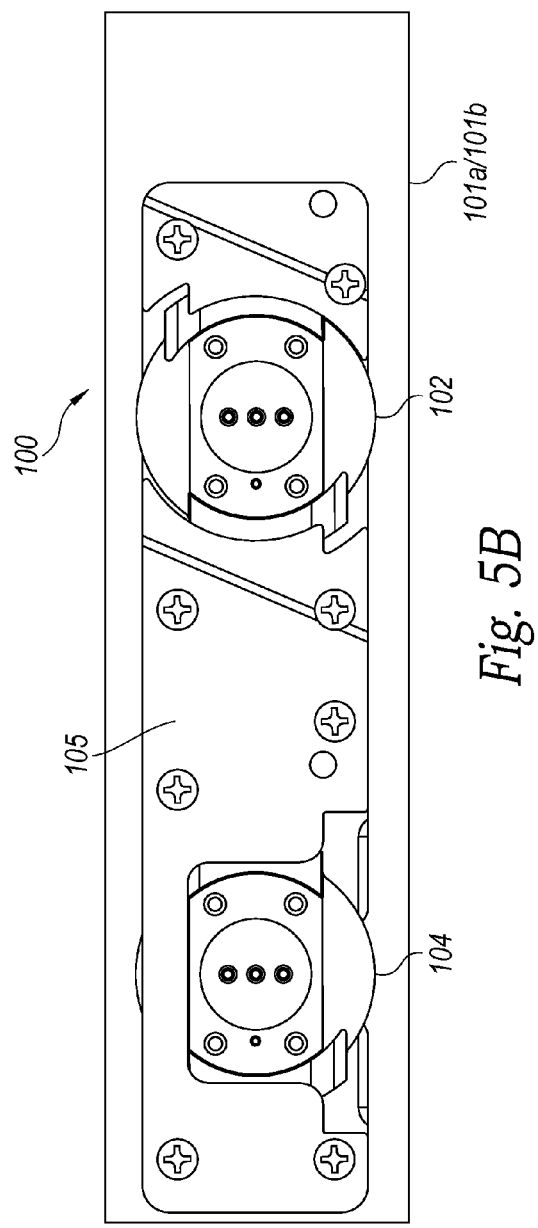

FIGS. 5A and 5B are schematic diagrams illustrating engagement of the male connectors 102 and 104 of FIG. 2 and the female connector 106 and the alignment slot 108 of the coupler assembly 105 of FIGS. 4A-4C. FIG. 5A illustrates two male connectors 102 and 104, viewed from behind as mounted to a corresponding first module housing 101a (schematically shown in phantom lines) along the mounting axis

202. The first module housing 101*a* is shown angularly offset with respect to a second module housing 101*b* to which the coupler assembly 105 is affixed. An initial offset angle for mating the male connector 102 of the first module housing 101*a* and the female connector 106 of the second module housing 101*b* is shown by a guide marking 502 on the coupler assembly 105. As shown, the front male connector 102 is axially aligned with the female connector 106 and has been moved through the space in the outer plate 402 into a mated position in which the connector face 302 of the connector 102 is in close proximity to or in contact with the back surface 406 of the female connector 106. When the modules are rotated in relation to one another as shown by the arrow 504 indicating movement of the first module housing 101*a* with respect to the second module housing 101*b*, the front male connector 102 rotatingly engages the female connector 106 and the back male connector 104 slidingly engages the alignment slot 108. FIG. 5B shows the resulting fully engaged first module male connectors and second module coupler assembly.

FIGS. 6A and 6B illustrate connection of two communication network modules having the interconnection system of FIG. 1. In FIG. 6A, a first module 100*a* is mated with a second module 100*b* and pictured in the intermediate position. The front male connector 102 of the second module 100*b* is axially aligned and partly rotated with respect to the female connector 106 of the first module 100*a*; however, the back male connector 104 of the second module 100*b* is visible and not yet in engagement with the alignment slot 108 of the first module 100*a*. Depending on how the contact pins 306 of the second module's front male connector 102 and the first module's female connector 106 are configured, an electrical connection to transmit power and/or data between the modules may not be complete until the modules are in the fully engaged position. In FIG. 6B, the modules 100*a* and 100*b* are fully engaged, the connectors and alignment slot are fully aligned, and the modules are both physically and electrically connected.

Figure 7A:
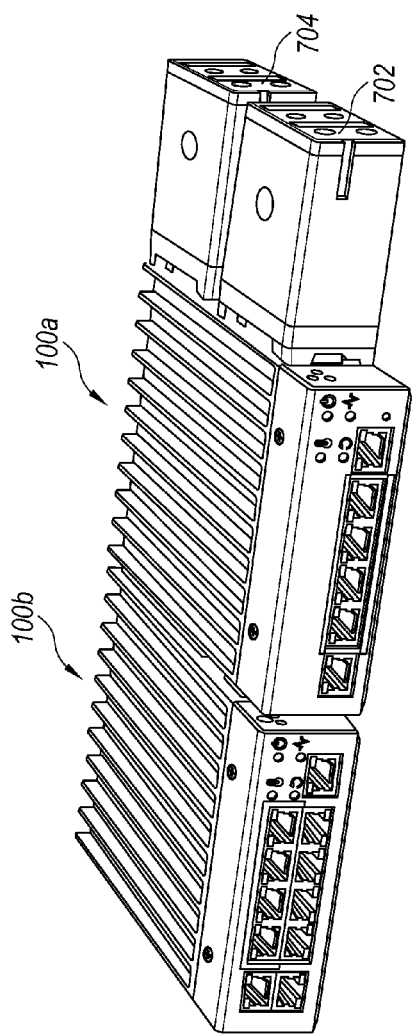
FIGS. 7A and 7B illustrate a series of communication network modules and power packs connected by the interconnection system of FIGS. 1A and 1B.
Figure 7B:
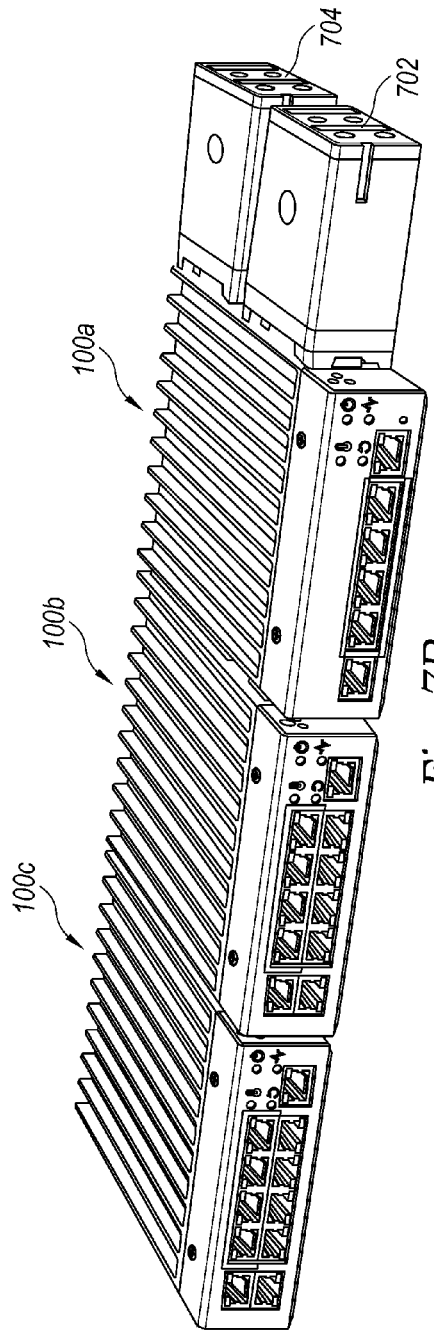

FIGS. 7A and 7B illustrate a series of communication network modules and power packs connected by the interconnection system of FIG. 1. In the arrangement shown in FIG. 7A, a battery pack 702 is connected to the front male connector 102 of the first module 100*a*, and another battery pack 704 is connected to the back male connector 104 of the first module 100*a*. The battery packs 702 and 704 are not connected to one another by a coupler, so they are independently connectable to and disconnectable from the first module 100*a*. The second module 100*b* is connected to the first module 100*a* via a pair of male connectors 102 and 104 on the second module 100*b* that releasably mate with the female connector 106 and the alignment slot 108 of the coupler assembly 105 on the first module 100*a* as described herein. The first and second modules 100*a* and 100*b* have common housing shapes and connector configurations, although the modules can include different communication network components operatively interconnectable with each other. The interconnected modules 100*a*/100*b* operate in tandem using the shared power and/or data paths provided by the disclosed connectors and the power transmitted from the battery packs 702 and 704 to both modules 100*a* and 100*b*. In the arrangement shown in FIG. 7B, the arrangement shown in FIG. 7A is expanded by a third module 100*c* connected in a daisy chain configuration, illustrating the flexible and expandable nature of the disclosed technology such that power and data can be provided to the third module 100*c* from the second module 100*b* via the mating connectors.

The above Detailed Description of examples and embodiments of the technology is not intended to be exhaustive or to limit the technology to the precise form disclosed above. Although specific examples for the technology are described above for illustrative purposes, various equivalent modifications are possible within the scope of the technology, as those skilled in the relevant art will recognize.

References throughout the foregoing description to features, advantages, or similar language do not imply that all of the features and advantages that may be realized with the present technology should be or are in any single embodiment of the technology. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements. Further any specific numbers noted herein are only examples: alternative implementations may employ differing values or ranges.

Although the above description describes various embodiments of the technology and the best mode contemplated, regardless how detailed the above text, the technology can be practiced in many ways. Details of the system may vary considerably in its specific implementation, while still being encompassed by the present disclosure. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

From the foregoing, it will be appreciated that specific embodiments of the technology have been described herein for purposes of illustration, but that various modifications may be made without deviating from the spirit and scope of the various embodiments of the technology. Further, while various advantages associated with certain embodiments of the technology have been described above in the context of those embodiments, other embodiments may also exhibit such advantages, and not all embodiments need necessarily exhibit such advantages to fall within the scope of the technology. Accordingly, the technology is not limited, except as by the appended claims.

Although certain aspects of the technology are presented below in certain claim forms, the applicant contemplates the various aspects of the technology in any number of claim forms. Accordingly, the applicant reserves the right to pursue additional claims after filing this application to pursue such additional claim forms, in either this application or in a continuing application.

We claim:

1. A network module releasably connectable to any one of a plurality of similarly configured network modules, the network module comprising:
   a housing;
   at least two male connectors connected to a first portion of the housing and spaced apart from each other, each male connector including:
      a body portion having a substantially planar front face;
      at least one flange extending beyond the body portion; and
      a sloped camming surface coupled to the flange and having a variable distance from the front face; and
      a plurality of first electrical contacts; and
   a female connector and an alignment mechanism connected to a second portion of the housing and spaced apart from each other, the female connector having a plurality of second electrical contacts, the plurality of first and second contacts being configured for power transmission to and from the network module.

2. The network module of claim 1 wherein the at least two male connectors are aligned along a mounting axis.

3. The network module of claim 1 wherein each male connector has a pair of flanges disposed substantially opposite one another and extending radially from the body portion.

4. The network module of claim 3 wherein each of the pair of flanges has a sloped camming surface coupled thereto and the flanges are radially symmetric and in an inverted orientation relative to each other.

5. The network module of claim 1 wherein the body portion of each male connector is substantially circular.

6. The network module of claim 1 wherein the camming surface is integrally connected to the at least one flange.

7. The network module of claim 1, further comprising a substantially flat friction pad at an end of the camming surface.

8. The network module of claim 1 wherein the plurality of first electrical contacts include at least two power contacts and at least one serial data contact.

9. The network module of claim 1 wherein each connector is connectable to a Harris AN/PRC-152 radio battery pack.

10. The network module of claim 1 wherein the female connector comprises:
    a substantially planar back face coupled to the second portion of the housing;
    a front opening adjacent to the back face and sized to releasably receive a connector corresponding to one of the male connectors; and
    a plurality of second electrical contacts operatively coupled to the plurality of first electrical contacts for transmission of power and data therethrough.

11. The network module of claim 1 wherein the at least two male connectors are spaced apart by a first distance, and wherein the female connector and the alignment mechanism are spaced apart from each other by a second distance substantially corresponding to the first distance.

12. The network module of claim 1 wherein the female connector has a sealing mechanism configured to form a seal between the female connector and a mating male connector of a second network module.

13. A plurality of communication network modules operably and releasably connectable to each other, comprising:
    first and second network modules, each comprising
    a housing;
    at least two male connectors connected to a first portion of the housing and spaced apart from each other, each male connector including:
       a body portion having a substantially planar front face;
       at least one flange extending beyond the body portion; and
       a sloped camming surface coupled to the flange and having a variable distance from the front face; and
       a plurality of first electrical contacts; and
    a female connector and an alignment mechanism connected to a second portion of the housing and spaced apart from each other, the female connector having a plurality of second electrical contacts, the plurality of first and second electrical contacts being configured for power and data transmission to and from the network module;
    wherein the male connectors of the first network module are rotationally and releasably engagable with the female connector and alignment mechanism of the second network module and with the plurality of first electrical contacts of the first network module operatively engaging the plurality of second electrical contacts of the second network module to provide a mechanical and electrical interconnection between the first and second network modules; and
    wherein the male connectors of the second network module are rotationally and releasably engagable with the female connector and alignment mechanism of the first network module and with the plurality of first electrical contacts of the second network module operatively engaging the plurality of second electrical contacts of the first network module to provide a mechanical and electrical interconnection between the first and second network modules.

14. The plurality of communication network modules of claim 13 wherein the male connectors of the first network are movable as a unit in an arcuate path relative to the female connector and alignment mechanism of the second network module and between disengaged, intermediate, and fully engaged positions, with a first one of the male connectors of the first network module being positionable in the female connector of the second network module and in alignment with an axis of rotation extending through the female connector of the second network module, and wherein the sloped camming surface of the first male connector of the first network module causing lateral movement of the first male connector of the first network module along the axis of rotation as the male connectors move between the intermediate and fully engaged positions.

15. The plurality of communication network modules of claim 13 wherein each male connector has a pair of flanges disposed substantially opposite one another and extending radially from the body portion.

16. The plurality of communication network modules of claim 13 wherein the plurality of first electrical contacts include at least two power contacts and at least one serial data contact.

17. The plurality of communication network modules of claim 13, further comprising a power pack module releasably connectable to at least one of the first or second network modules.

18. The plurality of communication network modules of claim 13, further comprising a power pack module releasably connectable to at least one of the male connectors of the first network module, wherein the power pack provides power to the first network module through the at least one of the male connectors of the first network module, and wherein the female connector of the first network module is connected one of the male connectors of the second network module to provide the power from the first network module to the second network module.

19. The plurality of communication network modules of claim 13 wherein each female connector has a sealing mechanism configured to form a seal between the female connector and a mating male connector to which the female connector connects when in the fully engaged position.

20. A communication network module having an interconnection system, comprising:
    a first module having a first flanged connector and a second flanged connector; and
    a second module having a receiving connector and an alignment slot, such that the receiving connector is configured to receive the first module's first flanged connector and the alignment slot is configured to receive the first module's second flanged connector by:
        alignment of the first flanged connector with the receiving connector;
        bringing together of the first flanged connector and the receiving connector; and
        rotation of the modules relative to each other, to cause:
            rotational engagement of the first flanged connector with the receiving connector, and
            translational engagement of the second flanged connector with the alignment slot.

21. The communication network module of claim 20 wherein the first flanged connector and the receiving connector further include electrical contacts, such that the contacts transmit electrical power and data between the modules.

22. The communication network module of claim 20 wherein at least two modules each have a first flanged connector and a second flanged connector, and wherein the modules are connected to each other in a series, and wherein each flanged connector is further configured to accept a rechargeable battery pack, such that if one flanged connector of one module is attached to a rechargeable battery pack, the connectors transmit electrical power to each module in the connected series of modules.

\* \* \* \* \*